United States Patent [19]

Orban

[11] Patent Number: 4,745,089
[45] Date of Patent: May 17, 1988

[54] SELF-ALIGNED BARRIER METAL AND OXIDATION MASK METHOD

[75] Inventor: Richard A. Orban, Raleigh, N.C.

[73] Assignee: General Electric Company, N.Y.

[21] Appl. No.: 60,490

[22] Filed: Jun. 11, 1987

[51] Int. Cl.[4] .......................................... H01L 21/283
[52] U.S. Cl. .................................... 437/190; 437/192; 437/194; 437/962; 437/982; 437/200; 357/71; 148/DIG. 106
[58] Field of Search ...................... 437/190, 192, 194, 437/200, 203, 238, 981, 982, 962; 148/DIG. 105, DIG. 106; 357/67, 71; 156/653

[56] References Cited

U.S. PATENT DOCUMENTS

| | | | |
|---|---|---|---|
| 3,479,237 | 11/1969 | Bergh et al. | 148/DIG. 106 |
| 3,566,457 | 3/1971 | Engeler | 148/DIG. 105 |
| 3,640,782 | 2/1972 | Brown et al. | 148/187 |
| 4,141,022 | 2/1979 | Sigg et al. | 437/192 |
| 4,361,599 | 11/1982 | Wourms | 437/190 |
| 4,436,582 | 3/1984 | Saxena | 156/656 |
| 4,507,851 | 4/1985 | Joyner et al. | 437/190 |
| 4,535,528 | 8/1985 | Chen et al. | 437/982 |
| 4,657,628 | 4/1987 | Holloway et al. | 156/643 |

OTHER PUBLICATIONS

Blakeslee et al, "Aluminum Etch Mask for Plasma Etching" *IBM Tech. Disc. Bull.*, vol. 21, No. 3, Aug. 1978, pp. 1256-1258.

Ting et al, "The Use of Titanium-Based Contact . . ." *Thin Solid Films*, 96 (1982), pp. 327-345.

Wittmer et al, "Applications of TiN Thin Films . . . ", *Thin Solid films*, 93 (1982), pp. 397-405.

Primary Examiner—Brian E. Hearn
Assistant Examiner—T. N. Quach
Attorney, Agent, or Firm—S. C. Corwin; B. E. Morris

[57] ABSTRACT

A method for using a self-aligned electromigration barrier metal and flow oxidation mask utilizing titanium nitride as the preferred embodiment. After providing a metallic mask layer, contact openings in a semiconductor substrate are sputtered with suitable metal (in the preferred embodiment, titanium) in a suitable atmosphere (in the present embodiment, nitrogen) to deposit a thin layer of material at the exposed junction sites. This deposited material serves as a barrier to spiking with an overlying metallic interconnect layer, improves contact adherence, and serves as an oxidation mask during subsequent high temperature flow processing steps. The metallic mask layer is removed, and optionally an interlevel oxide layer is flowed to provide a better contact between a subsequent metallic interconnect level and the barrier metal/oxidation mask material. After any flow step, a metallic contact layer may be formed to the silicon junction through the barrier metal/oxidation mask material. Thereafter, standard processing of the substrate may continue. The barrier metal/oxidation mask eliminates spiking of semiconductor juctions by metallic interconnect layers, provides a good contact interface, and protects semiconductor junctions from formation of an oxide layer during a flow process.

18 Claims, 7 Drawing Sheets

SELF-ALIGNED BARRIER METAL AND OXIDATION MASK METHOD

BACKGROUND OF THE INVENTION

1. Field of the Invention

This invention relates to integrated circuit manufacturing techniques, and more particularly to a technique using a self-aligned barrier of refractory material to prevent contact metal electromigration or "spiking", to provide good contact adherence, and to provide a junction oxidation mask.

2. Related Art

In manufacturing integrated circuits, a typical problem in using aluminum to form contacts to a semiconductor surface (such as silicon) is that the semiconductor material may dissolve into the aluminum. As the semiconductor material migrates into the aluminum, voids may be created in the semiconductor. The voids may penetrate the junction underneath the semiconductor material, creating excessive junction leakage current known as "spiking". Therefore, it would be desirable to develop a processing technique whereby such spiking is prevented. In the past, silicon doping was used in the metallic interconnect material, with the intention of preventing spiking. However, such silicon frequently precipitated into large nodules which often caused broken metal lines or unreliable contacts.

Some attempt has been made to use other metals such as molybdenum or tungsten as a contact material rather than aluminum. While such materials may not exhibit spiking problems, they do have problems in adequately adhering to many semiconductor materials.

The inventive solution to the problem of spiking is to deposit a metallic barrier to the aluminum. The barrier ideally should have a low contact resistance, be able to withstand thermal cycling up to temperatures of about 600° C., have a low level of contaminants, and be easy to pattern with fine geometry lines.

The present invention accomplishes this goal by using a refractory metallic material, which, in the preferred embodiment, is titanium nitride (TiN). The TiN is used as a self-aligned deposition over silicon contact holes using a dual-level masking scheme. The TiN acts as a barrier metal preventing spiking of an overcoat of aluminum contact metal through the silicon junction. A deposition of TiN may also be used when other metal compositions (such as molybdenum) are used instead of aluminum, as they may more readily adhere to TiN.

Another problem associated with contact holes to a silicon junction is that it is at times difficult to insure that a metal interconnect layer makes adequate contact through an insulating oxide, due to the fact that holes that are typically etched through such an oxide are typically sharp edged, and can cause mechanical stress fractures in the overlying metal. To prevent such stress fractures, after contact holes are etched through an interlevel oxide, the semiconductor wafer is subjected to a temperature treatment designed to flow the interlevel oxide and provide smoother surface features. However, this process often causes a thin layer of silicon oxide, an insulator, to cover the surface of a silicon junction. The TiN acts as a barrier metal providing an oxidation mask that prevents oxidation of the contact holes during the processing step of contact etch flow.

Therefore, it is desirable to provide a means not only for preventing spiking of a contact metal through a semiconductor junction, or to promote adequate adherence of a contact metal, but also to prevent oxidation from occurring at the junction site when flow processing is used.

SUMMARY OF THE INVENTION

The present invention comprises a self-aligned barrier metal and oxidation mask utilizing titanium nitride as the preferred embodiment. In the preferred embodiment, a silicon substrate is coated with an interlevel insulating layer (such as silicon oxide), which is in turn coated with a metallic layer (using, e.g. aluminum or a refractory metal). A photoresist layer is deposited on the metal, patterned in known fashion, and the metal is etched in accordance with that pattern. The photoresist layer is removed and the etched metal layer serves as an etch mask for the underlying interlevel oxide. The interlevel oxide is etched down to the layer of the substrate surface, thereby exposing sites that are to become semiconductor junctions. Still using the etched metal layer as a mask, the semiconductor wafer is sputtered with suitable metal (in the preferred embodiment, titanium) in a suitable atmosphere (in the present embodiment, nitrogen) to deposit a thin layer of material (approximately 1000 angstroms) at the exposed junction sites. This deposited material serves as a barrier to spiking from an overlying metallic interconnect layer, provides a good contact interface, and also serves as an oxidation mask during subsequent flow processing steps.

After the deposit of the barrier metal and oxidation mask material, the metallic mask layer is removed, and optionally the interlevel oxide is flowed so that better mechanical contact between a subsequent metallic interconnect level and the barrier metal/oxidation mask material will occur. After the optional flow step, a metallic contact layer may be electrically connected to the semiconductor junction through the barrier metal/oxidation mask material. Thereafter, standard processing of the semiconductor wafer may continue.

The advantages of the present invention are the elimination of spiking of semiconductor junctions by metallic interconnect layers, provision of a good contact interface, and protection of silicon junctions from formation of an oxide layer during a flow process. The inventive technique utilizes a self-aligned mask process for creating the barrier metal/oxidation mask material, thereby reducing the number of mask steps required. Further, using a metal mask to pattern the interlevel oxide provides a more reliable mask than simple photoresist materials. Moreover, use of the present invention permits elimination of the use of silicon in the metallic interconnect material.

The process steps and techniques employed in the preferred embodiment of the present invention will be better understood by reference to the following figures.

DESCRIPTION OF THE DRAWINGS

Like reference numbers in the various drawings refer to like elements.

DETAILED DESCRIPTION OF THE INVENTION

The present invention will be described in the context of forming an aluminum contact to a silicon junction utilizing titanium nitride as a barrier metal and oxidation mask. However, the present invention is not limited to the materials specifically identified in the discussion of the preferred embodiment, but extends to any equivalent materials performing the same function in the same manner.

Figure 1:
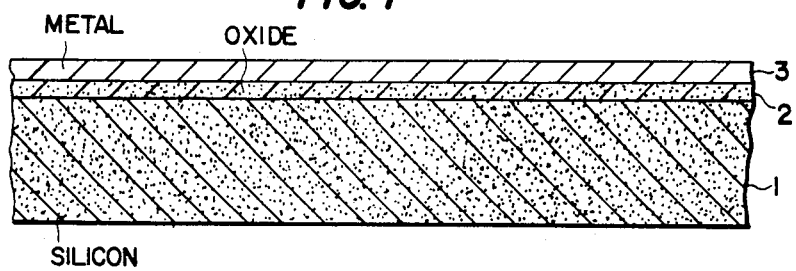
FIG. 1 is a cross-section of a first intermediate stage of manufacture of an integrated circuit fabricated in conformance with the present invention.

FIG. 1 shows, at an intermediate level of processing, a cross-section of a silicon wafer being employed as a substrate in the manufacture of integrated circuits. The silicon substrate 1 has been coated in known fashion with an interlevel insulator, silicon oxide, 2, which in turn has been coated in known fashion with a layer of metal 3. The metal may be, for example, aluminum or a refractory metal such as tungsten.

Figure 2:
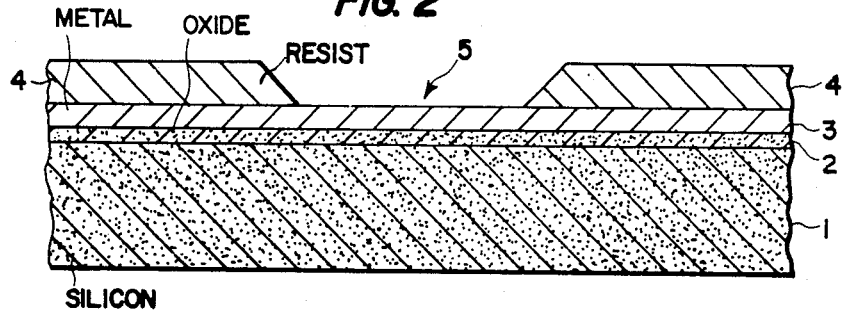
FIG. 2 is a cross-section of a second intermediate stage of an integrated circuit fabricated in conformance with the present invention.

FIG. 2 shows a next intermediate step in the manufacture of integrated circuits utilizing the present invention. A photoresist layer 4 has been applied to the metal layer 3, and patterned in known fashion, to create an opening 5 through which selected portions of the metal layer 3 can be etched. The formation of the photoresist layer and its patterning is in accordance with known techniques and principles.

Figure 3:
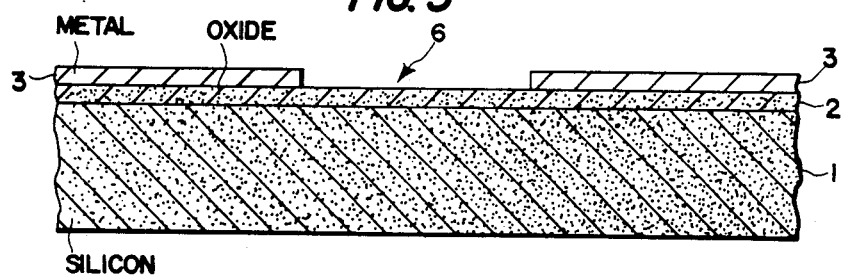
FIG. 3 is a cross-section of a third intermediate stage of an integrated circuit fabricated in conformance with the present invention.

FIG. 3 shows the next intermediate stage of processing in which the metal layer 3 has been subjected to an etchant (e.g., a chemical etchant such as hydrochloric acid, or ion or plasma etching) in known fashion such that selected portions of the metal layer 3 are removed to expose an underlying portion 6 of the interlevel oxide 2, and in which the photoresist layer of FIG. 2 has been removed in known fashion. At this intermediate stage, the processed product thus comprises the substrate 1 coated with the interlevel oxide 2 and a patterned metal layer 3.

Figure 4:
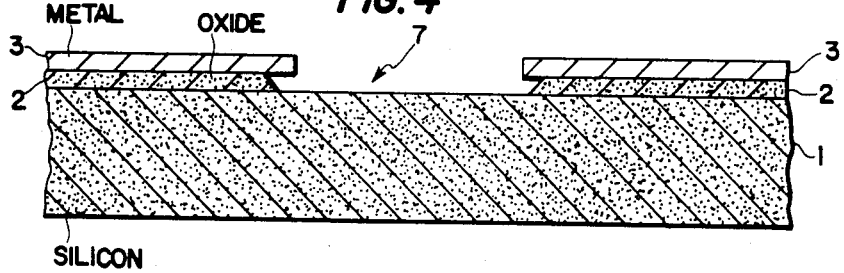
FIG. 4 is a cross-section of a fourth intermediate stage of an integrated circuit fabricated in conformance with the present invention.

FIG. 4 is a depiction of the next stage of processing, in which the patterned metal layer 3 is used as a mask layer. The interlevel oxide layer 2 exposed by the openings in the metal layer 3 are subjected to an etchant (e.g., a chemical etchant such as buffered hydrofluoric acid, or ion or plasma etching) in known fashion, which removes a portion of the interlevel oxide 2 over selected sites 7 of the substrate 1. In some cases, undercutting of the metal mask layer 3 may occur.

Figure 5:
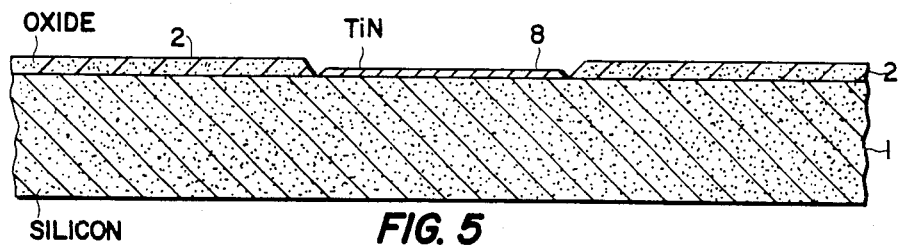
FIG. 5 is a cross-section of a fifth intermediate stage of an integrated circuit fabricated in conformance with the present invention.

After the interlevel oxide layer 2 is etched to expose selected portions 7 of the substrate 1, in the preferred embodiment the substrate is subjected to a sputtering process wherein titanium is deposited onto the surface of the substrate 1 in a nitrogen ambient atmosphere to deposit a thin layer (typically about 1000 angstroms) of titanium nitride on the exposed sites 7 of the silicon substrate 1 to form a barrier metal/oxidation mask deposit 8 (shown in FIG. 5).

Figure 7:
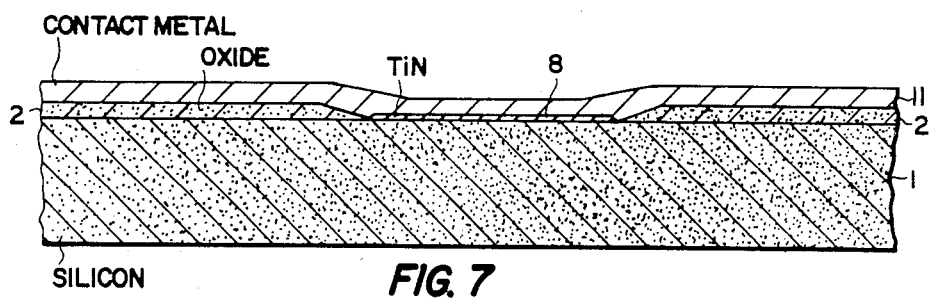
FIG. 7 is a cross-section of a seventh intermediate stage of an integrated circuit fabricated in conformance with the present invention.

The titanium nitride layer 8 serves to prevent the junction material from spiking through to the metallic interconnect layer 11, shown in FIG. 7, thereby preventing failure of the integrated circuits being formed on the substrate 1.

Thereafter, the metal layer 3 is removed using conventional techniques, leaving the substrate patterned and layered as shown in FIG. 5.

Figure 6:
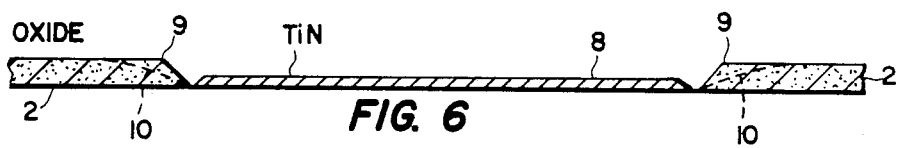
FIG. 6 is a cross-section of a sixth intermediate stage of an integrated circuit fabricated in conformance with the present invention.

As a next optional step, shown in FIG. 6, the substrate 1 is subjected to a flow process in which the entire substrate is heated in an appropriate manner (for example, in an oxygen ambient atmosphere in a temperature range of from about 850° C. to 1050° C.) so that the interlevel oxide layer 2 flows, causing sharp edges 9 to be rounded as the interlevel oxide material is redistributed, as shown by the dotted lines 10 in FIG. 6.

The titanium nitride layer 8 serves as an oxidation mask during the flow process, preventing the underlying silicon junction sites from being oxidized, thereby creating an undesirable insulating layer.

Lastly, as shown in FIG. 7, a metal contact layer 11 (for example, aluminum) is applied to the surface of the processed substrate 1, in known fashion, to provide electrical contact to the titanium nitride barrier metal/oxidation mask layer.

Further processing steps may be employed as desired after the above process steps are conducted to complete the integrated circuit structures.

Other embodiments of the inventive concept would be obvious to one skilled in the art. Thus, as noted before, different materials having similar characteristics may be substituted for the materials identified in the illustrated embodiment. For example, a composition of approximately 85% tungsten and 15% titanium may be used rather than pure titanium in the described sputtering step. Further, various doping processes well-known in the art may be applied as desired at appropriate times in the manufacturing process. Therefore, the scope of the invention is not limited to the present disclosure, but by the scope of the following claims.

I claim:

1. A method for forming a self-aligned barrier layer for use in the manufacture of at least one electronic device on a semiconductor substrate, comprising at least the steps of:
   a. forming an insulating layer on the substrate;
   b. forming a metallic layer on the insulating layer;
   c. forming an etch-resistant layer on the metallic layer;
   d. selectively removing part of the etch-resistant layer, thereby exposing part of the underlying metallic layer;
   e. removing the exposed part of the metallic layer, thereby exposing part of the underlying insulating layer;
   f. removing the remainder of the etch-resistant layer, and the exposed part of the insulating layer, thereby exposing part of the underlying substrate;
   g. depositing barrier material on the exposed substrate;
   h. removing the remainder of the metallic layer; and
   i. depositing a metallic contact layer over the insulating layer and in contact with the barrier material.

2. The method of claim 1, wherein the semiconductor substrate comprises silicon.

3. The method of claim 1, wherein the insulating layer comprises silicon oxide.

4. The method of claim 1, wherein the metallic contact layer comprises aluminum.

5. The method of claim 1, wherein the barrier material comprises approximately 85% tungsten and 15% titanium.

6. The method of claim 1, wherein the barrier material comprises titanium nitride.

7. The method of claim 6, wherein the titanium nitride barrier material is formed by the step of sputtering titanium onto the exposed substrate in a nitrogen ambient atmosphere.

8. The method of claim 6, wherein the titanium nitride barrier material is deposited to a thickness of approximately 1000 angstroms.

9. A method for forming a self-aligned barrier layer and oxidation mask for use in the manufacture of at least one electronic device on a semiconductor substrate, comprising at least the steps of:
   a. forming an insulating layer on the substrate;
   b. forming a metallic layer on the insulating layer;
   c. forming an etch-resistant layer on the metallic layer;
   d. selectively removing part of the etch-resistant layer, thereby exposing part of the underlying metallic layer;
   e. removing the exposed part of the metallic layer, thereby exposing part of the underlying insulating layer;
   f. removing the remainder of the etch-resistant layer, and the exposed part of the insulating layer, thereby exposing part of the underlying substrate;
   g. depositing barrier material on the exposed substrate;
   h. removing the remainder of the metallic layer;
   i. flowing the exposed insulating layer to prevent stress point sites; and
   j. depositing a metallic contact layer over the insulating layer and in contact with the barrier material.

10. The method of claim 9, wherein the semiconductor substrate comprises silicon.

11. The method of claim 9, wherein the insulating layer comprises silicon oxide.

12. The method of claim 9, wherein the metallic contact layer comprises aluminum.

13. The method of claim 9, wherein the barrier material comprises approximately 85% tungsten and 15% titanium.

14. The method of claim 9, wherein the barrier material comprises titanium nitride.

15. The method of claim 14, wherein the titanium nitride barrier material is formed by the step of sputtering titanium onto the exposed substrate in a nitrogen ambient atmosphere.

16. The method of claim 14, wherein the titanium nitride barrier material is deposited to a thickness of approximately 1000 angstroms.

17. A method for forming a self-aligned barrier layer for use in the manufacture of at least one electronic device on a semiconductor silicon substrate, comprising at least the steps of:
   a. forming an insulating oxide layer on the substrate;
   b. forming a metallic layer on the insulating layer;
   c. forming an etch-resistant layer on the metallic layer;
   d. selectively removing part of the etch-resistant layer, thereby exposing part of the underlying metallic layer;
   e. removing the exposed part of the metallic layer, thereby exposing part of the underlying insulating oxide layer;
   f. removing the remainder of the etch-resistant layer, and the exposed part of the insulating oxide layer, thereby exposing part of the underlying silicon substrate;
   g. forming a barrier layer on the exposed substrate by sputtering titanium onto the exposed substrate in a nitrogen ambient atmosphere;
   h. removing the remainder of the metallic layer; and
   i. depositing an aluminum contact layer over the insulating oxide layer and in contact with the barrier layer;
whereby the barrier layer prevents semiconductor junction spiking.

18. A method for forming a self-aligned barrier layer and oxidation mask for use in the manufacture of at least one electronic device on a semiconductor silicon substrate, comprising at least the steps of:
   a. forming an insulating oxide layer on the substrate;
   b. forming a metallic layer on the insulating layer;
   c. forming an etch-resistant layer on the metallic layer;
   d. selectively removing part of the etch-resistant layer, thereby exposing part of the underlying metallic layer;
   e. removing the exposed part of the metallic layer, thereby exposing part of the underlying insulating oxide layer;
   f. removing the remainder of the etch-resistant layer, and the exposed part of the insulating oxide layer, thereby exposing part of the underlying silicon substrate;
   g. forming a barrier layer and oxidation mask on the exposed substrate by sputtering titanium onto the exposed substrate in a nitrogen ambient atmosphere;
   h. removing the remainder of the metallic layer;
   i. flowing the exposed insulating oxide layer to prevent stress point sites; and
   j. depositing an aluminum contact layer over the insulating oxide layer and in contact with the barrier layer and oxidation mask;
whereby the barrier layer and oxidation mask prevent semiconductor junction spiking and oxidation of the semiconductor junction during the flow process step.

* * * * *